United States Patent
Quintal et al.

(10) Patent No.: US 12,414,258 B2
(45) Date of Patent: Sep. 9, 2025

(54) ADJUSTABLE SHELF/SLOT KEYING ASSEMBLIES AND METHODS FOR TELECOMMUNICATIONS AND NETWORKING EQUIPMENT

(71) Applicant: Ciena Corporation, Hanover, MD (US)

(72) Inventors: Raymond Quintal, Stittsville (CA); Simon Shearman, Carleton Place (CA); Jacques Cote, Nepean (CA)

(73) Assignee: Ciena Corporation, Hanover, MD (US)

( * ) Notice: Subject to any disclaimer, the term of this patent is extended or adjusted under 35 U.S.C. 154(b) by 271 days.

(21) Appl. No.: 18/131,975

(22) Filed: Apr. 7, 2023

(65) Prior Publication Data
US 2024/0341053 A1    Oct. 10, 2024

(51) Int. Cl.
*H05K 7/18*    (2006.01)

(52) U.S. Cl.
CPC .................... *H05K 7/186* (2013.01)

(58) Field of Classification Search
CPC .......... H05K 1/189; H05K 1/14; H05K 7/186; H05K 7/18; H05K 7/1485; H05K 3/0097; H05K 7/1491; G06F 1/1626; G06F 21/86; G06F 1/1681; G06F 1/1616; G06F 1/1679; G06F 1/1662; G06F 1/1624; G06F 1/1637; G06F 1/1618; G06F 1/1643; G06F 1/1632; G06F 1/1615; G06F 1/1683; G06F 1/1654; G06F 1/1656; G06F 1/1601; G06F 1/166; G06F 1/1677; G06F 1/1669; G06F 1/169; H01R 13/46; H01R 13/514; H04Q 1/00
See application file for complete search history.

(56) References Cited

U.S. PATENT DOCUMENTS

| | | | | |
|---|---|---|---|---|
| 2,940,016 A | * | 6/1960 | Flint | H05K 7/04 |
| | | | | 174/166 S |
| 2,968,019 A | * | 1/1961 | Steinman | H01R 12/722 |
| | | | | 361/802 |
| 3,018,460 A | * | 1/1962 | Stevens | H01R 13/645 |
| | | | | 439/362 |
| 3,601,455 A | * | 8/1971 | Spieth | F16C 29/12 |
| | | | | 384/165 |
| 4,350,409 A | * | 9/1982 | Kato | H01R 13/6456 |
| | | | | 439/681 |

(Continued)

FOREIGN PATENT DOCUMENTS

| | | | | |
|---|---|---|---|---|
| CH | | 586962 A5 * | 4/1977 | ........... H01R 13/645 |
| CN | | 202930812 U * | 5/2013 | |

(Continued)

*Primary Examiner* — Abhishek M Rathod
(74) *Attorney, Agent, or Firm* — Clements Bernard Walker; Christopher L. Bernard

(57) ABSTRACT

A telecommunications and networking equipment housing including: a body defining a slot adapted to receive a shelf; and an adjustable key component coupled to the body and defining a channel adapted to receive a fixed key component coupled to the shelf, wherein the channel is movable between a first location and a second location along a front edge of the slot. The fixed key component coupled to the shelf is aligned with the channel defined by the adjustable key component in either the first location or the second location. The adjustable key component is translatable along the front edge of the slot such that the channel is movable between the first location and the second location.

20 Claims, 12 Drawing Sheets

(56) References Cited

U.S. PATENT DOCUMENTS

| | | | | |
|---|---|---|---|---|
| 4,376,565 A * | 3/1983 | Bird | H01R 13/6456 | 439/681 |
| 5,125,856 A * | 6/1992 | Schlegel | H01R 13/642 | 439/78 |
| 5,140,744 A * | 8/1992 | Miller | A47B 87/00 | 429/96 |
| 5,159,545 A * | 10/1992 | Lee | H02M 5/12 | 439/103 |
| 5,402,320 A * | 3/1995 | Kielstra | H05K 7/1438 | 361/752 |
| 5,892,658 A * | 4/1999 | Urda | H05K 7/20545 | 361/728 |
| 6,105,794 A * | 8/2000 | Bauer | A47B 96/063 | 211/208 |
| 6,626,407 B1 * | 9/2003 | Miller | A47B 57/42 | 248/912 |
| 6,865,085 B1 * | 3/2005 | Ferris | H05K 7/20445 | 165/185 |
| 6,880,239 B1 * | 4/2005 | Jennings | H01R 43/205 | 29/729 |
| 7,316,590 B2 * | 1/2008 | Zueck | H01R 13/6456 | 439/681 |
| 7,318,754 B1 * | 1/2008 | Vaden | H01R 13/64 | 439/502 |
| 8,608,493 B2 * | 12/2013 | Cowles | H05K 7/1455 | 439/138 |
| 8,733,563 B2 * | 5/2014 | Fadrowski | A47F 5/0025 | 211/144 |
| 9,223,336 B2 * | 12/2015 | Petersen | H02G 3/00 | |
| 9,253,927 B1 * | 2/2016 | Kull | H05K 7/14 | |
| 9,877,407 B1 * | 1/2018 | Sim | H04Q 1/06 | |
| 10,447,016 B2 * | 10/2019 | Francisquini | H05K 7/1417 | |
| 10,736,227 B1 * | 8/2020 | Rivaud | H05K 7/1447 | |
| 2002/0029727 A1 * | 3/2002 | Dickinson | A47B 96/06 | 108/152 |
| 2002/0111078 A1 * | 8/2002 | Sevier | H01R 13/6456 | 439/680 |
| 2004/0038568 A1 * | 2/2004 | Woolsey | H05K 7/1489 | 439/135 |
| 2004/0080249 A1 * | 4/2004 | Harvie, III | A47B 96/061 | 312/351 |
| 2005/0115152 A1 * | 6/2005 | Levesque | H05K 7/186 | 49/192 |
| 2005/0259406 A1 * | 11/2005 | Gramse | H05K 7/16 | 361/752 |
| 2006/0009080 A1 * | 1/2006 | Regnier | H01R 12/725 | 439/637 |
| 2006/0040556 A1 * | 2/2006 | Neer | H01R 13/6595 | 439/607.37 |
| 2006/0203446 A1 * | 9/2006 | Radhakrishnan | H05K 7/20172 | 361/695 |
| 2006/0286869 A1 * | 12/2006 | Looney | H01R 13/6456 | 439/633 |
| 2008/0159256 A1 * | 7/2008 | Faska | H04L 49/351 | 370/349 |
| 2013/0064508 A1 * | 3/2013 | Kelly | G02B 6/3831 | 385/75 |
| 2013/0239391 A1 * | 9/2013 | Pettigrew | F16L 37/1225 | 29/428 |
| 2013/0288494 A1 * | 10/2013 | Cowles | H05K 7/1455 | 439/133 |
| 2015/0138724 A1 * | 5/2015 | Teeter | H05K 5/0208 | 361/679.48 |
| 2015/0181752 A1 * | 6/2015 | Bailey | G06F 21/86 | 312/236 |
| 2015/0282373 A1 * | 10/2015 | AbuGhazaleh | H05K 7/1488 | 312/273 |
| 2015/0289388 A1 * | 10/2015 | Conway | H05K 7/1471 | 312/265.5 |
| 2016/0095259 A1 * | 3/2016 | Campbell | F04D 25/14 | 165/138 |
| 2016/0242307 A1 * | 8/2016 | Qi | G06F 1/185 | |
| 2018/0131975 A1 * | 5/2018 | Badawiyeh | H04N 21/6543 | |
| 2018/0228049 A1 * | 8/2018 | Liao | A47B 88/477 | |
| 2018/0303005 A1 * | 10/2018 | Besterman | F16M 13/02 | |
| 2018/0335595 A1 * | 11/2018 | Takeuchi | G02B 6/44526 | |
| 2019/0174651 A1 * | 6/2019 | Crawford | H05K 7/1495 | |
| 2020/0100380 A1 * | 3/2020 | Michna | H05K 7/1455 | |
| 2021/0103112 A1 * | 4/2021 | Claes | G02B 6/44528 | |
| 2022/0183188 A1 * | 6/2022 | Lee | H05K 7/20145 | |

FOREIGN PATENT DOCUMENTS

| | | | | |
|---|---|---|---|---|
| CN | 203039275 U | * | 7/2013 | |
| CN | 203041350 U | * | 7/2013 | |
| CN | 106300110 A | * | 1/2017 | |
| CN | 206313347 U | * | 7/2017 | |
| CN | 213425521 U | * | 6/2021 | |
| CN | 115296175 A | * | 11/2022 | |
| CN | 118352904 B | * | 10/2024 | |
| DE | 29620410 U1 | * | 1/1998 | H05K 7/1455 |
| EP | 0644626 A2 | * | 3/1995 | H01R 13/645 |
| EP | 3306755 A1 | * | 4/2018 | H01R 12/7005 |
| WO | WO-2019226574 A1 | * | 11/2019 | H05K 7/1497 |

* cited by examiner

ADJUSTABLE SHELF/SLOT KEYING ASSEMBLIES AND METHODS FOR TELECOMMUNICATIONS AND NETWORKING EQUIPMENT

TECHNICAL FIELD

The present disclosure relates generally to the telecommunications and networking equipment fields. More particularly, the present disclosure relates to adjustable shelf/slot keying assemblies and methods for telecommunications and networking equipment.

BACKGROUND

In telecommunications and networking equipment it is common to insert various shelves, such as power shelves or the like, into a housing that includes a backplane to which electrical connections are made. It is often desirable that only certain types of shelves are inserted into certain housing slots, especially to ensure that only compatible shelves are used together. In order to ensure this, the shelves and slots are sometimes keyed using fixed mechanical structures at the front/sides of each shelf and slot. Alternatively, keying may be provided at the backplane connectors or through software control systems.

Fixed mechanical structures suffer from the fact that each slot may only be manufactured to accept one type of shelf, limiting application flexibility and adjustability. Backplane connector keying suffers from the same application flexibility and adjustability limitations. In addition, backplane connector keys are hidden from view once a shelf is partially slotted such that shelf-slot compatibility may not be determined until a shelf is almost completely slotted. Finally, software control system keying, in addition to being expensive, allows an incompatible shelf to be completely slotted and powered up/started before incompatibility is determined, essentially defeating the purpose of shelf/slot keying.

SUMMARY

The present disclosure provides adjustable shelf/slot keying assemblies and methods for telecommunications and networking equipment. Each slot of a housing includes at least one adjustable key component that is adapted to receive only a shelf that includes at least one corresponding fixed key component. For example, each slot may include a left adjustable key component and a right adjustable key component, although additional/alternative adjustable key components (e.g., center, top, bottom) may be utilized, with each shelf including a corresponding left fixed key component and right fixed key component (and/or center fixed key component, top fixed key component, bottom fixed key component, etc.). Each adjustable key component may be disposed in multiple configurations, such that multiple shelf compatibility configurations may be established by a manufacturer or user of the housing, which each slot then only accepting a correspondingly fixed keyed shelf. The adjustable key components are preferably disposed near the front of each slot, such that they may be adjusted and viewed by a user before and as a shelf is slotted. The adjustable key components may serve multiple slots and shelves simultaneously, such as vertically-stacked slots and shelves, for example. The fixed key components of the shelves may be disposed near the front and/or back of each shelf, such that they may guide the slotting and/or final seating of a shelf. The adjustable shelf/slot keying assemblies of the present disclosure ensure that only compatible shelves, such as power shelves or the like, are used together in a housing.

In one illustrative embodiment, the present disclosure provides a telecommunications and networking equipment housing including: a body defining a slot adapted to receive a shelf; and an adjustable key component coupled to the body and defining a channel adapted to receive a fixed key component coupled to the shelf, wherein the channel is movable between a first location and a second location along a front edge of the slot. The fixed key component coupled to the shelf is aligned with the channel defined by the adjustable key component in either the first location or the second location. The adjustable key component is translatable along the front edge of the slot such that the channel is movable between the first location and the second location. Alternatively, the adjustable key component is rotatable with respect to the front edge of the slot such that the channel is movable between the first location and the second location. Alternatively, the adjustable key component includes a first key component that is disposable in a recess formed in the front edge of the slot and a second key component that is disposable in the recess formed in the front edge of the slot, such that the channel is movable between the first location and the second location by switching between the first key component and a first channel defined by the first key component being coupled to the body and the second key component and a second channel defined by the second key component being coupled to the body. The channel includes a recess with a stop located at a back portion thereof, wherein the recess is adapted to receive and retain a front fixed key component disposed at a front portion of the shelf when the shelf is fully inserted into the slot. Alternatively, the channel includes a groove, wherein the groove is adapted to receive and pass through a back fixed key component disposed at a back portion of the shelf when the shelf is partially inserted into the slot and receive and retain a front fixed key component disposed at a front portion of the shelf when the shelf is fully inserted into the slot. Optionally, the body defines an additional slot disposed adjacent to the slot adapted to receive an additional shelf adjacent to the shelf; and the adjustable key component defines an additional channel adjacent to the channel adapted to receive an additional fixed key component coupled to the additional shelf, wherein the additional channel is movable between a first location and a second location along a front edge of the additional slot as the channel is movable between the first location and the second location along the front edge of the slot. The housing also includes a backplane disposed at a back portion of the housing and adapted to make an electrical connection with a connector disposed at a back portion of the shelf when the shelf is fully inserted into the slot.

In another illustrative embodiment, the present disclosure provides a telecommunications and networking equipment assembly including: a shelf including a fixed key component coupled to an external surface thereof; and a housing including: a body defining a slot adapted to receive the shelf; and an adjustable key component coupled to the body and defining a channel adapted to receive the fixed key component coupled to the shelf, wherein the channel is movable between a first location and a second location along a front edge of the slot. The fixed key component coupled to the shelf is aligned with the channel defined by the adjustable key component in either the first location or the second location. The adjustable key component is translatable along the front edge of the slot such that the channel is movable between the first location and the second location. Alternatively, the adjustable key component is rotatable with respect to the front edge of the slot such that the channel is movable between the first location and the second location. Alternatively, the adjustable key component includes a first key component that is disposable in a recess formed in the front edge of the slot and a second key component that is disposable in the recess formed in the front edge of the slot, such that the channel is movable between the first location and the second location by switching between the first key component and a first channel defined by the first key component being coupled to the body and the second key component and a second channel defined by the second key component being coupled to the body. The channel includes a recess with a stop located at a back portion thereof, wherein the recess is adapted to receive and retain a front fixed key component disposed at a front portion of the shelf when the shelf is fully inserted into the slot. Alternatively, the channel includes a groove, wherein the groove is adapted to receive and pass through a back fixed key component disposed at a back portion of the shelf when the shelf is partially inserted into the slot and receive and retain a front fixed key component disposed at a front portion of the shelf when the shelf is fully inserted into the slot. Optionally, the assembly also includes an additional shelf including an additional fixed key component coupled to an external surface thereof, wherein: the body defines an additional slot disposed adjacent to the slot adapted to receive the additional shelf adjacent to the shelf; and the adjustable key component defines an additional channel adjacent to the channel adapted to receive the additional fixed key component coupled to the additional shelf, wherein the additional channel is movable between a first location and a second location along a front edge of the additional slot as the channel is movable between the first location and the second location along the front edge of the slot. The housing also includes a backplane disposed at a back portion thereof and adapted to make an electrical connection with a connector disposed at a back portion of the shelf when the shelf is fully inserted into the slot.

In a further illustrative embodiment, the present disclosure provides a telecommunications and networking equipment method including: given a housing including a body defining a slot adapted to receive a shelf and an adjustable key component coupled to the body and defining a channel adapted to receive a fixed key component coupled to the shelf, wherein the channel is movable between a first location and a second location along a front edge of the slot, moving the channel between the first location and the second location. The fixed key component coupled to the shelf is aligned with the channel defined by the adjustable key component in the second location, the method further including inserting the shelf into the slot with the fixed key component coupled to the shelf engaging the channel defined by the adjustable key component.

DETAILED DESCRIPTION OF THE DRAWINGS

The present disclosure is illustrated and described with reference to the various drawings, in which like reference numbers are used to denote like assembly components/method steps, as appropriate, and in which.

Figure 11:
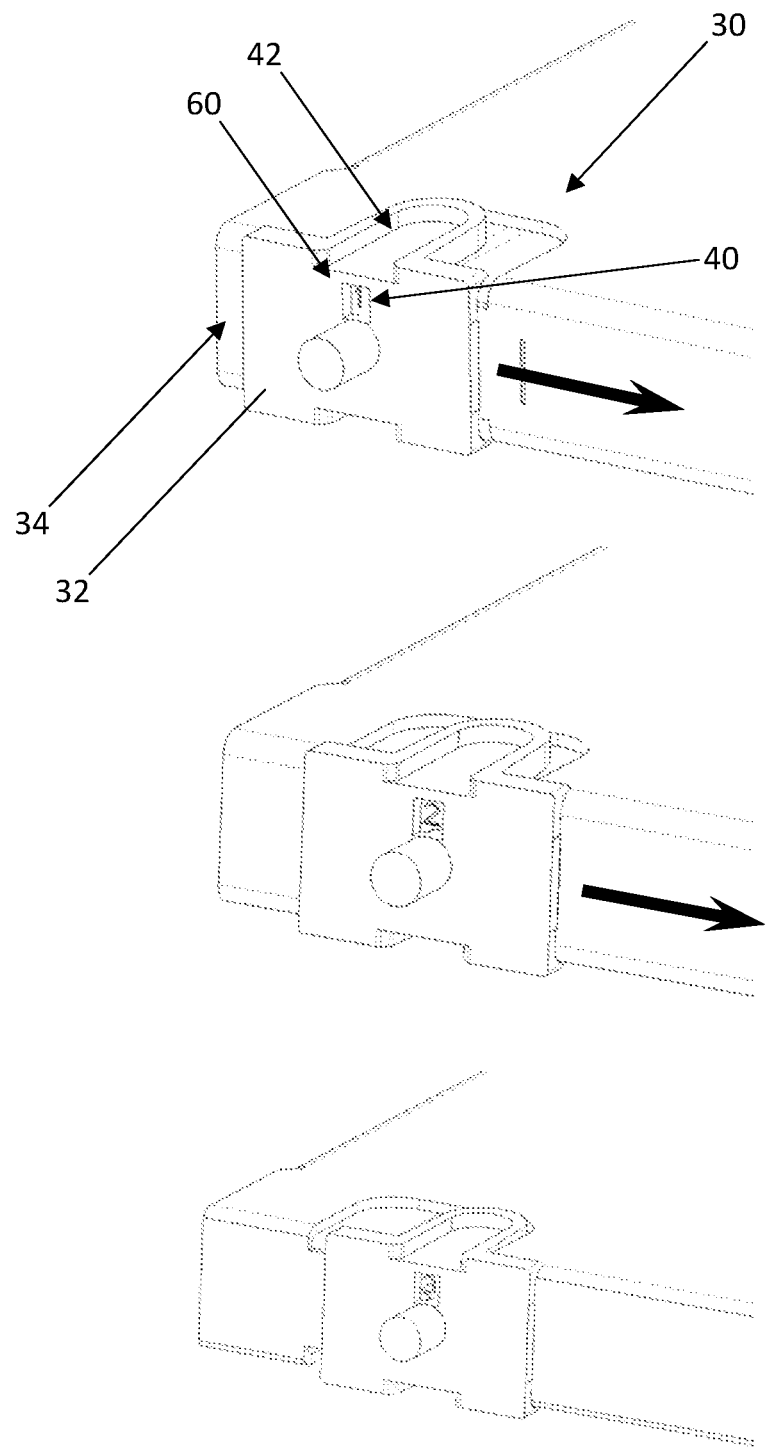
Figure 12:
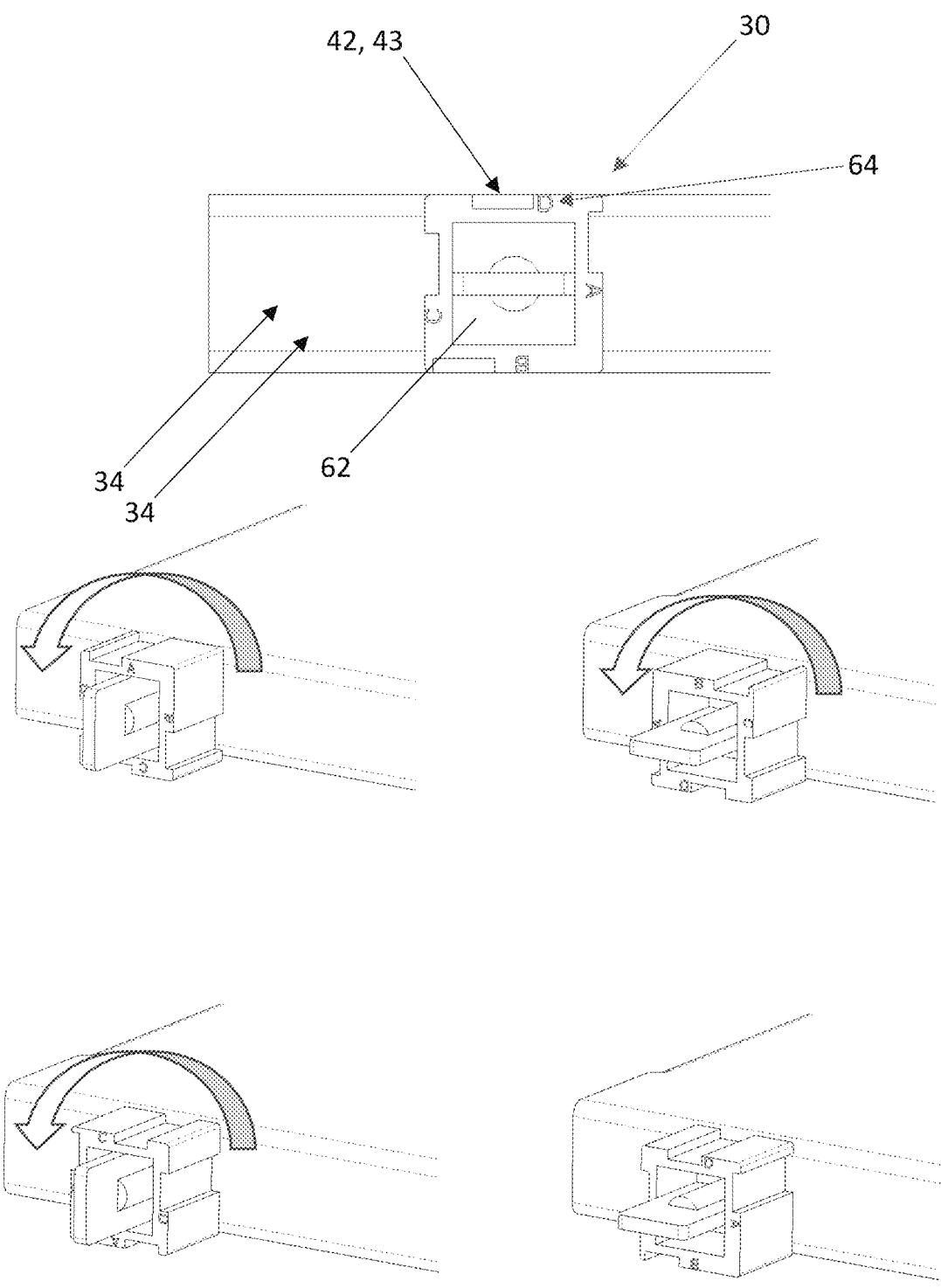

FIG. 11 is a series of perspective views of another embodiment of the adjustable key component of the present disclosure, the adjustable key component being translatable between multiple (position 1, position 2, and position 3) configurations; and FIG. 12 is a series of front planar and perspective views of a further embodiment of the adjustable key component of the present disclosure, the adjustable key component being rotatable between multiple (position A, position B, position C, and position D) configurations.

It will be readily apparent to those of ordinary skill in the art that aspects and embodiments illustrated in the present disclosure may be utilized individually or combined as desired in a given application.

DETAILED DESCRIPTION

Again, the present disclosure provides adjustable shelf/slot keying assemblies and methods for telecommunications and networking equipment. Each slot of a housing includes at least one adjustable key component that is adapted to receive only a shelf that includes at least one corresponding fixed key component. For example, each slot may include a left adjustable key component and a right adjustable key component, although additional/alternative adjustable key components (e.g., center, top, bottom) may be utilized, with each shelf including a corresponding left fixed key component and right fixed key component (and/or center fixed key component, top fixed key component, bottom fixed key component, etc.). Each adjustable key component may be disposed in multiple configurations, such that multiple shelf compatibility configurations may be established by a manufacturer or user of the housing, which each slot then only accepting a correspondingly fixed keyed shelf. The adjustable key components are preferably disposed near the front of each slot, such that they may be adjusted and viewed by a user before and as a shelf is slotted. The adjustable key components may serve multiple slots and shelves simultaneously, such as vertically-stacked slots and shelves, for example. The fixed key components of the shelves may be disposed near the front and/or back of each shelf, such that they may guide the slotting and/or final seating of a shelf. The adjustable shelf/slot keying assemblies of the present disclosure ensure that only compatible shelves, such as power shelves or the like, are used together in a housing.

Figure 1:
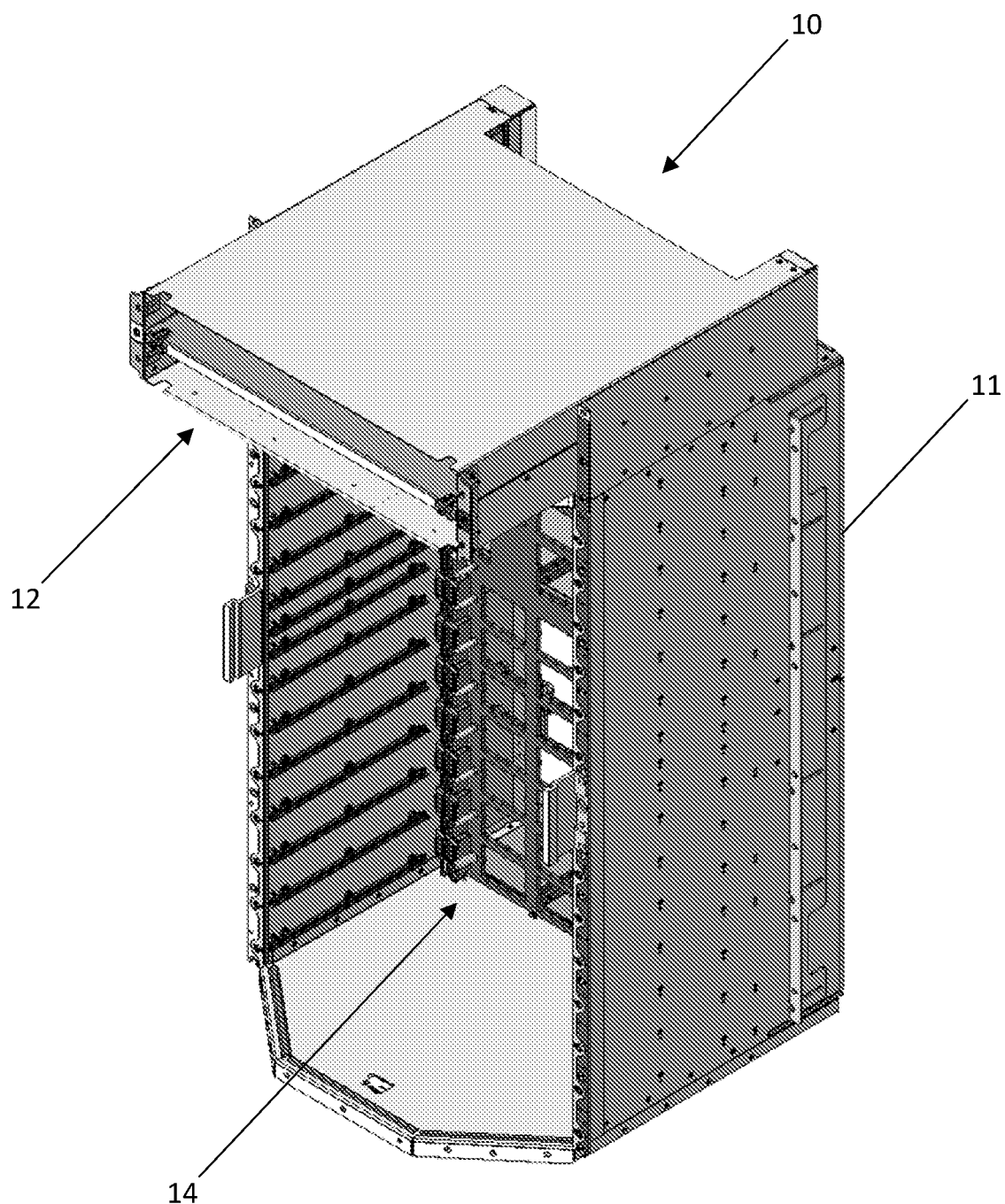
FIG. 1 is a perspective view of a housing of the present disclosure, including a plurality of slots adapted to receive a plurality of shelves.

Referring now to FIG. 1, the housing 10 of the present disclosure defines a plurality of slots 12 adapted to receive a plurality of shelves, such as a plurality of power shelves or the like. The housing 10 generally includes a body 11 that forms the structure of the housing 10. The body 11 may be formed from a plurality of components or integrally formed and is typically manufactured from a metallic or other substantially rigid material. The housing 10 may also be referred to as a cabinet, rack, or the like. Similarly, each shelf may also be referred to as a module, card, box, or the like. The housing 10 also includes a backplane 14 that provides electrical connections for each shelf when it is inserted into the appropriate slot 12. Such components are common in the telecommunications and networking fields and are well known to those of ordinary skill in the art.

Figure 2:
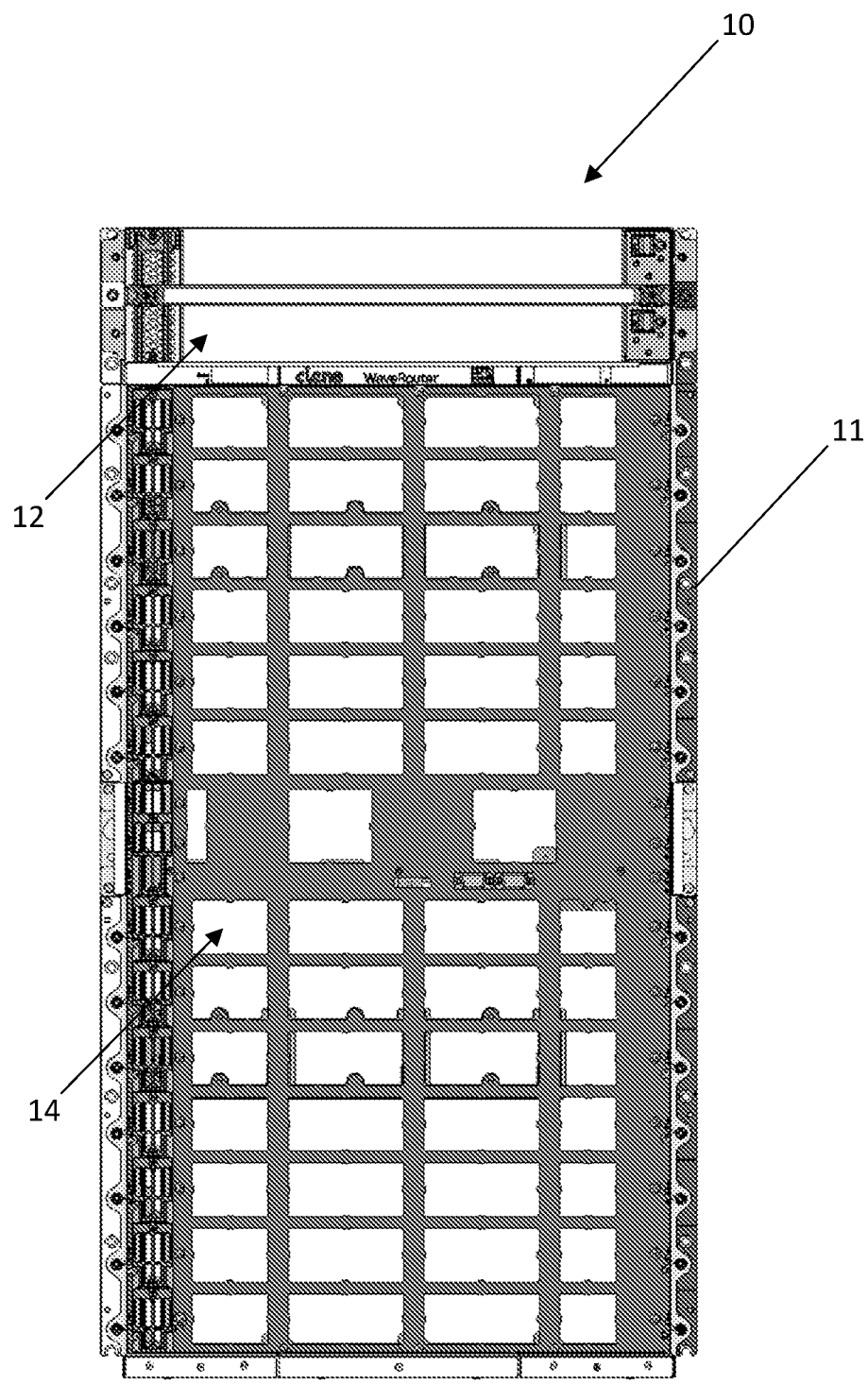
FIG. 2 is a front planar view of the housing of the present disclosure, including the plurality of slots adapted to receive the plurality of shelves.

Referring now to FIG. 2, the housing 10 of the present disclosure again defines the plurality of slots 12 adapted to receive the plurality of shelves, such as the plurality of power shelves or the like. The housing 10 generally includes the body 11 that forms the structure of the housing 10. The body 11 may be formed from a plurality of components or integrally formed and is typically manufactured from a metallic or other substantially rigid material. The housing 10 also includes the backplane 14 that provides electrical connections for each shelf when it is inserted into the appropriate slot 12. As illustrated here, two vertically-stacked slots 12 are provided near the top of the housing 10, adapted to receive two vertically-stacked shelves near the top of the housing 10. More or fewer slots 12 and shelves could be utilized and they could be disposed at any portion of the housing 10, for example in the middle of the housing 10 or near the bottom of the housing 10. Further, vertical stacking is not required and could be replaced by horizontal adjacency for example. In fact, when "vertical stacking" is used herein, horizontal adjacency is contemplated equally. Similarly, when "top" or "bottom" terminology is used herein, side placement is also contemplated equally.

In the context of the present disclosure, it is often desirable that only like types of shelves, or compatible shelves, be inserted into the (adjacent) slots 12 of the housing 10 for a given application. This forms a fundamental basis of the present disclosure—the housing 10 and shelves may be keyed such that only like types of shelves, or compatible shelves, may be inserted into the slots 12 of the housing 10. This keying is adjustable, such that the (adjacent) slots 12 of the housing 10 can be rekeyed to accept different types of compatible shelves in different applications. Advantageously, the adjustment mechanism of the present disclosure is simple and readily viewable by a user, both for adjustment and shelf insertion purposes. This overcomes the limitations of conventional approaches.

As discussed above, fixed mechanical key structures suffer from the fact that each slot may only be manufactured to accept one type of shelf, limiting application flexibility and adjustability. Backplane connector keying suffers from the same application flexibility and adjustability limitations. In addition, backplane connector keys are hidden from view once a shelf is partially slotted such that shelf-slot compatibility may not be determined until a shelf is almost completely slotted. Finally, software control system keying, in addition to being expensive, allows an incompatible shelf to be completely slotted and powered up/started before incompatibility is determined, essentially defeating the purpose of shelf/slot keying.

Figure 3:
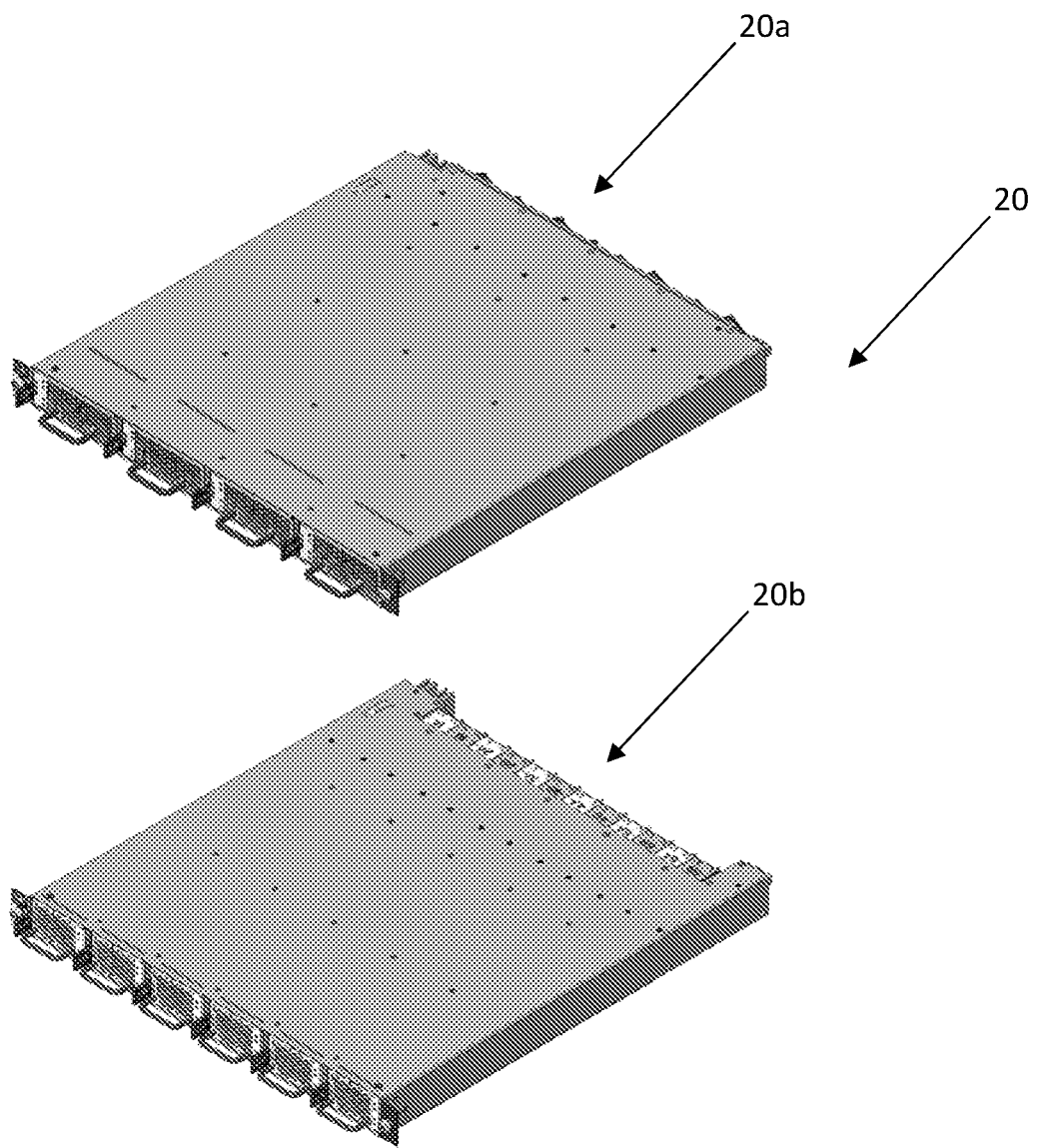
FIG. 3 is a perspective view of the plurality of shelves, including a first (type A) power shelf and a second (type B) power shelf by way of example.

FIG. 3 is a perspective view of the shelves 20 of the present disclosure, including a first (type A) power shelf 20a and a second (type B) power shelf 20b by way of example. A first type of fixed key component, with a first alignment, is coupled to a top, bottom, or side surface of the first type of shelf 20a, while a second type of fixed key component, with a second alignment, is coupled to a top, bottom, or side surface of the second type of shelf 20b, such that, depending on the alignment of the adjustable key component of the housing 10 (FIGS. 1 and 2) only the first type of shelf 20a or the second type of shelf 20b may be used in adjacent slots 12 (FIGS. 1 and 2) in a given application.

Figure 4:
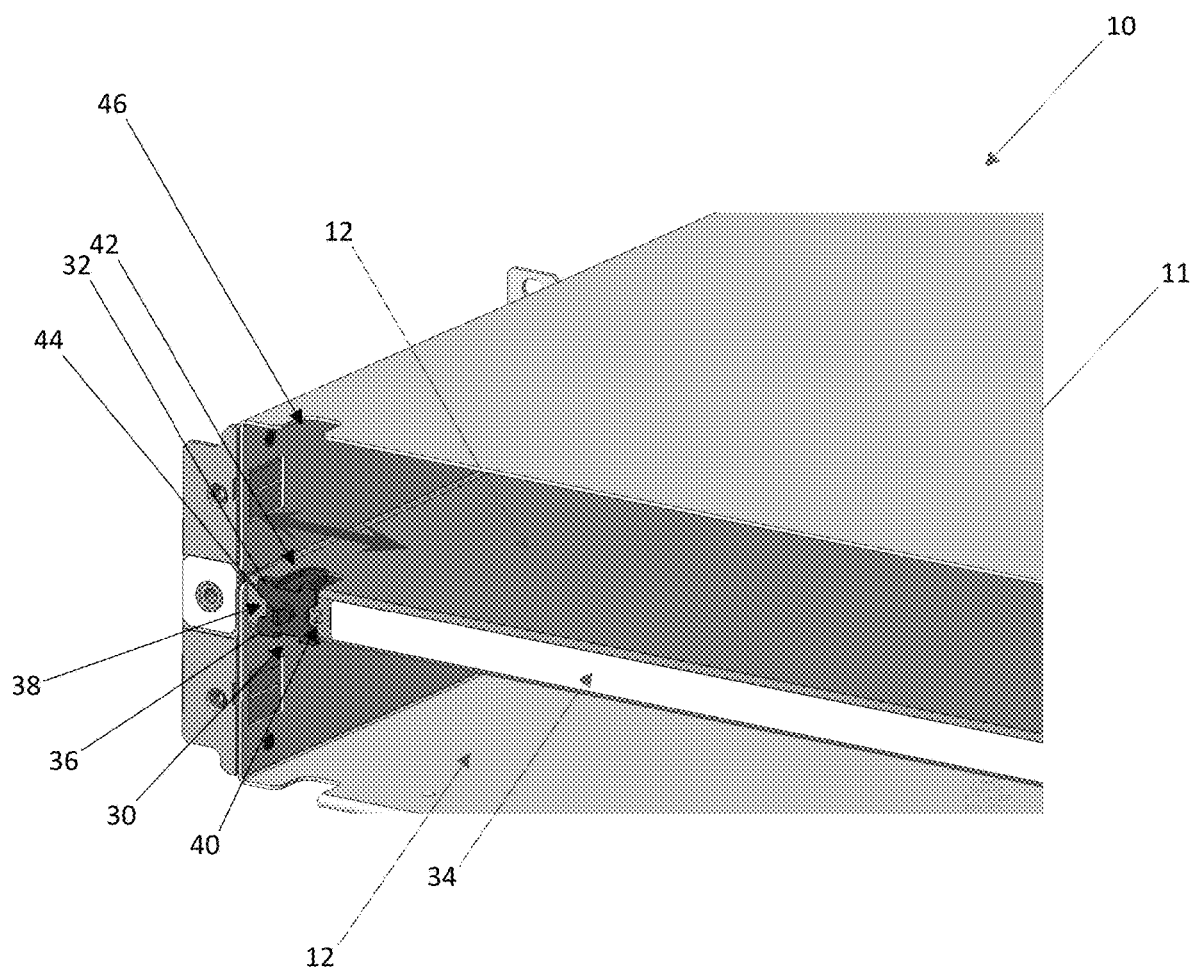
FIG. 4 is a perspective view of one embodiment of an adjustable key component of the present disclosure, the adjustable key component being translatable between first (position 1) and second (position 2) configurations.

FIG. 4 is a perspective view of one embodiment of the adjustable key component 30 of the present disclosure, the adjustable key component 30 being translatable between first (position 1) and second (position 2) configurations in the embodiment illustrated. Here, the adjustable key component includes a slider member 32 that may be translated along a front edge 34 of a slot 12 or, as illustrated, along a shared front edge 34 of adjacent (vertically-stacked) slots 12. As mentioned above, this translation may be horizontal along a top/bottom front edge 34 of the slot(s) 12, or could be vertical along a left/right front edge of the slot(s) 12. Similar configurations could also be used for horizontally adjacent slots. In the embodiment illustrated, the slider member 32 includes a plurality of arms 36 that surround and grasp the front edge 34 of the slot(s) 12. It will be readily apparent to those of ordinary skill in the art that other attachment/translation mechanisms may be used to couple the slider member 32 to the front edge 34 of the slot(s) 12 equally.

Sides and/or recesses 38 manufactured into the sides of the slider member 32 are adapted to selectively cover and expose a visual position indicator 40 provided at the front edge 34 of the slot(s). Thus, in the embodiment illustrated, when the slider member 32 is translated to the left, a "2" is visible to the right of the slider member 32, indicating a position 2 selection for the adjustable key component 30. When the slider member 32 is translated to the right, a "1" is visible to the left of the slider member 32, indicating a position 1 selection for the adjustable key component 30. Other types of configuration indicators can be used equally. In the embodiment illustrated, if left and right adjustable key components 30 are utilized, the left adjustable key component 30 can be disposed in configuration 1 or configuration 2 and the right adjustable key component 30 can also be disposed in configuration 1 or configuration 2, providing a plurality of discrete key combinations when used together. It should be noted that each adjustable key component 30 can select more that two positions and configurations in the same manner, providing more discrete key combinations when used together. For example, any number of detent slider member positions could be provided along with a visible indexing feature that appropriately indicates which configuration is selected by the user, with a cutout, window, or pointer and scale in or associated with the plastic key component exposing a different key position number as the plastic key component is slid along the front edge of 34 of a slot 12, instead of showing a position number either to the left or to the right of the plastic key component.

The slider member 32, which may be manufactured from a plastic or other suitable rigid material, defines a channel 42 in an outside surface thereof that forms the key slot for receiving the fixed key component of the associated shelf 20

(FIG. 3) when the shelf 20 is inserted into the slot 12 served by the slider member 32. This channel 42 is translated with the slider member 32 between positions, such that only a corresponding fixed key component associated with a given type of shelf 20a or 20b can be received in each position, as the various fixed key components are correspondingly offset. In the embodiment illustrated, the slider member 32 serves adjacent vertically-stacked slots 12, being translatably coupled to the front edge 34 disposed between the two slots 12. In this embodiment, the slider member 32 defines a channel 42 in a top surface of the slider member 32 and a corresponding channel 42 in a bottom surface of the slider member 32. These channels 42 are adapted to receive compatible fixed key components coupled to a bottom surface of a compatible top shelf 20 and a top surface of a compatible bottom shelf 20, respectively. Likewise, these channels 42 are adapted to not receive incompatible fixed key components coupled to a bottom surface of an incompatible top shelf 20 and a top surface of an incompatible bottom shelf 20, respectively. As mentioned above, this configuration may be repeated left and right (or top and bottom) for a given keying arrangement.

For ease of actuation and use, the slider member 32 may include a finger grab 44 or the like.

Each channel 42 includes a recess with a stop located at a back portion thereof, such that each channel forms a closed slot (as illustrated). The recess is adapted to receive and retain a front fixed key component disposed at a front portion of the corresponding shelf 20 when the shelf 20 is fully inserted into the associated slot 12. Alternatively, each channel 42 includes a groove without a stop located at a back portion thereof. The groove is adapted to receive and pass through a back fixed key component disposed at a back portion of the corresponding shelf 20 when the shelf 20 is partially inserted into the associated slot 12 and receive and retain a front fixed key component disposed at a front portion of the corresponding shelf 20 when the shelf 20 is fully inserted into the associated slot 12. In this embodiment, the channel 42 first acts as a guide for a back fixed key component of the shelf 20 and then as a retainer for the front fixed key component of the shelf 20 as the shelf is inserted into the associated slot 12 and compatibility is satisfied.

It should be noted that, in the embodiment illustrated, each channel 42 is adapted to translate within a recess 46 defined by the front edge 34 of the slot(s) 12. This recessed configuration may be used to bound the translation of the slider member 32. Any recesses 46 not occupied by a slider member 32 may simply be left open to accommodate unused fixed key components coupled to uninvolved surfaces of the compatible shelf 12.

Although a translating slider member 32 is illustrated and described, the present disclosure is not limited to this embodiment. The adjustable key component 30 may be rotatable with respect to the front edge 34 of the slot 12 such that the channel 42 is movable between the first location and the second location. In such an embodiment, for key positions could be provided, as the rotating key rotates to one of parallel edges of a rotating square or the like (others shapes with more or fewer sides could also be used). Alternatively, the adjustable key component 30 may simply include a first key component that is disposable in the recess 46 formed in the front edge 34 of the slot 12 and also a second key component that is disposable in the recess 46 formed in the front edge 34 of the slot 12, such that the channel 42 is movable between the first location and the second location by switching between the first key component and a first channel defined by the first key component and the second key component and a second channel defined by the second key component.

Figure 5:
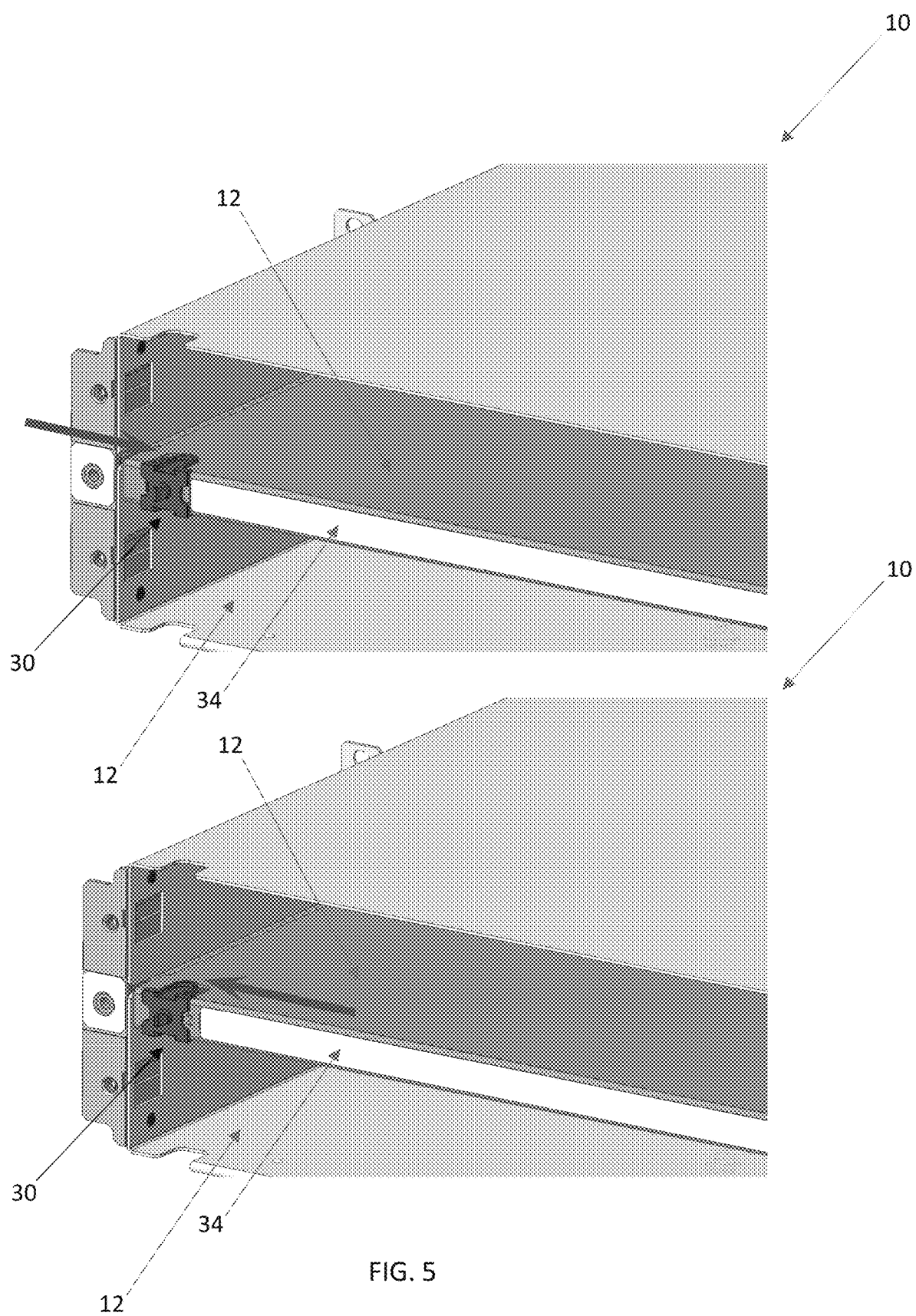
FIG. 5 is another series of perspective views of the adjustable key component being translated between the position 1 and position 2 configurations.

FIG. 5 illustrates the adjustable key component 30 being translated between the position 1 and position 2 configurations, by way of example.

Figure 6:
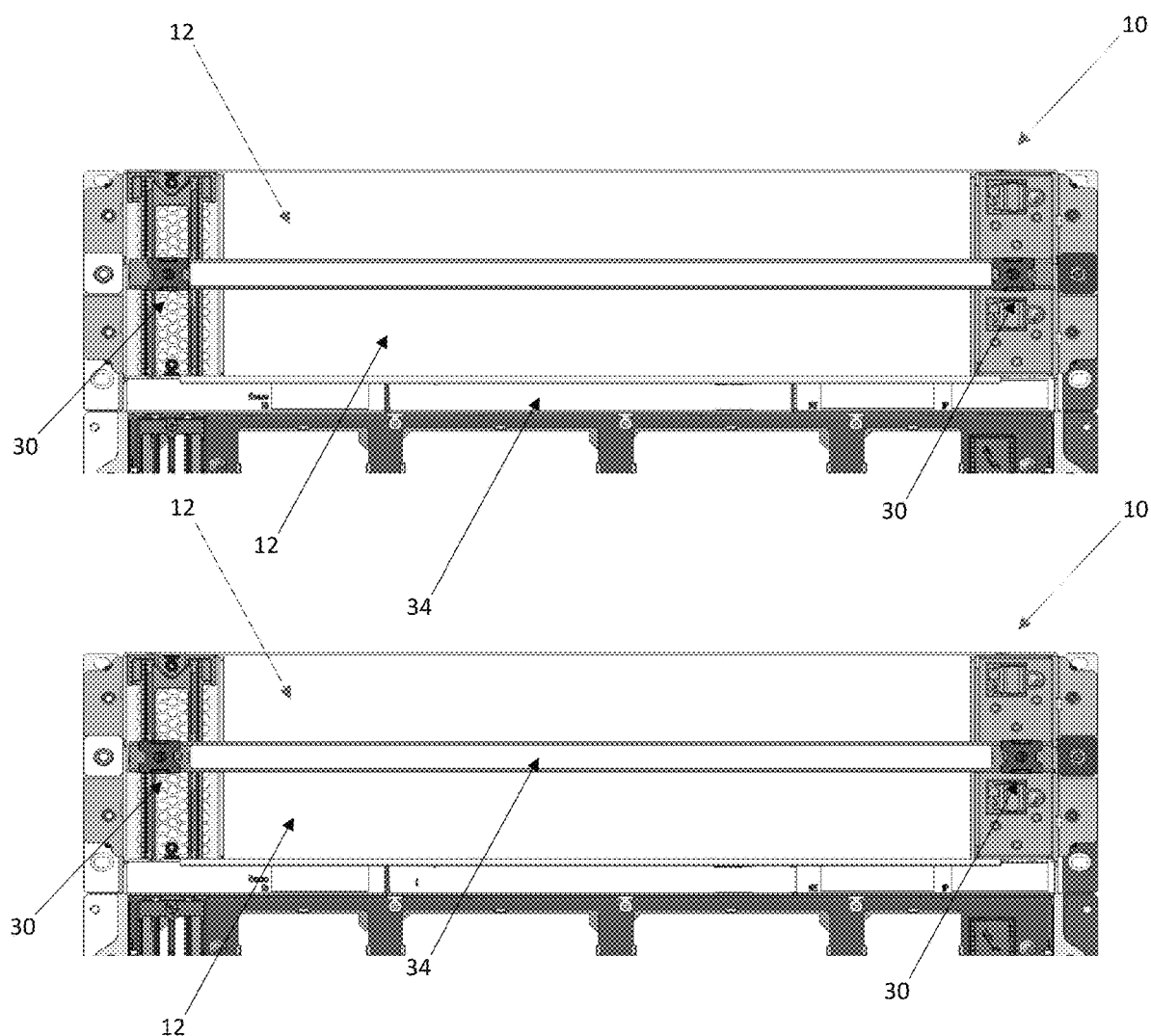
FIG. 6 is a series of front planar views of a pair of adjustable key components each being translated between the position 1 and position 2 configurations to alternately receive type A power shelves and type B power shelves in each of a pair of vertically arranged slots.

FIG. 6 illustrates a pair of adjustable key components 30 each being translated between the position 1 and position 2 configurations to alternately receive type A power shelves 20a and type B power shelves 20b in each of a pair of vertically-arranged slots 12. Again, more keying position may be used to provide more keying combinations.

Figure 7:
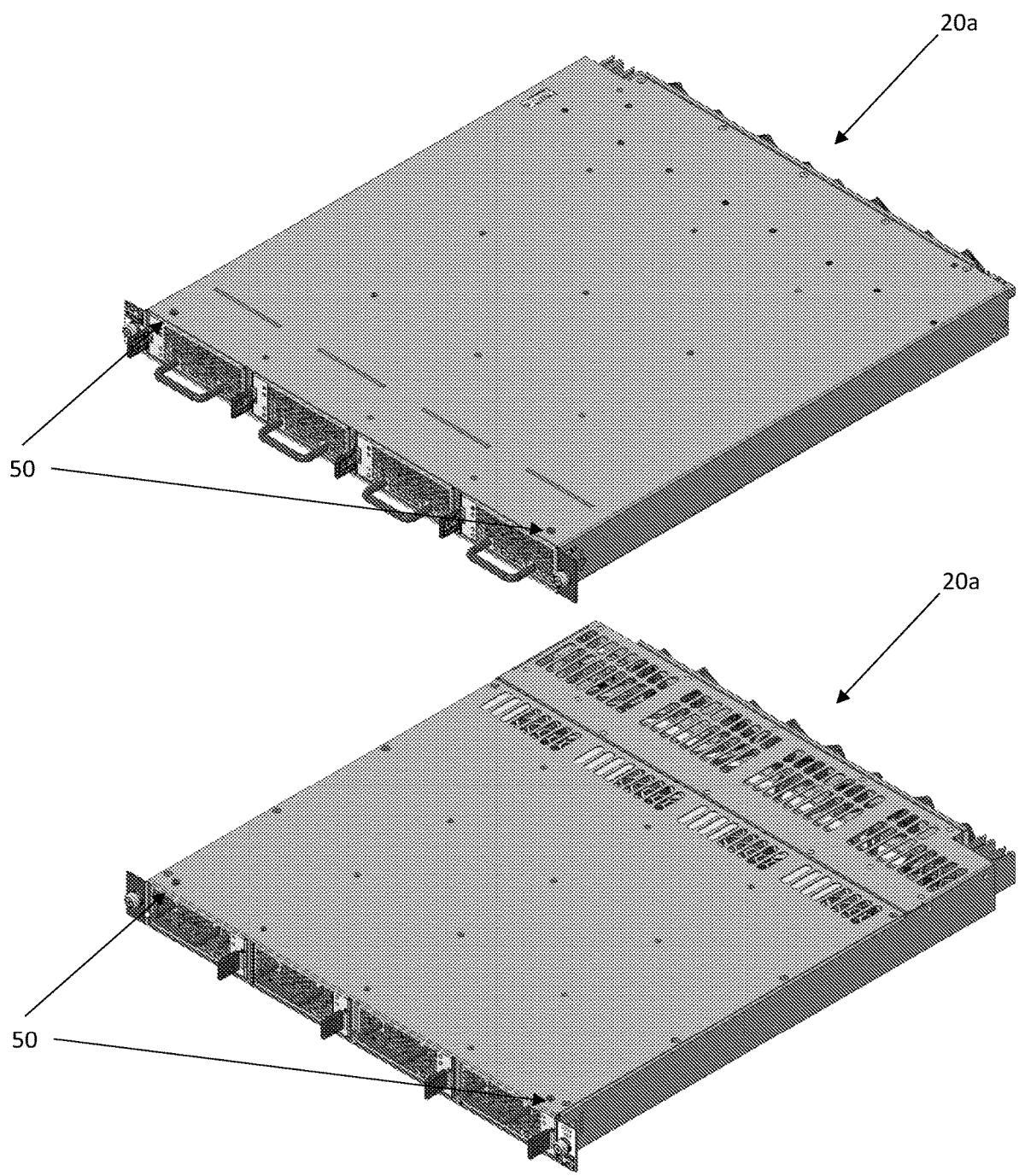
FIG. 7 is top and bottom perspective views of a type A power shelf, highlighting the associated fixed key components.

FIG. 7 is top and bottom perspective views of a type A power shelf 20a, highlighting the associated fixed key components 50. These fixed key components 50 may be disposed at the left and right sides of the front portion of the shelf 20a, for example, to mate with left and right adjustable key components 30 (FIGS. 4-6) of the corresponding slot(s) 12 (FIGS. 1, 2, and 4-6). Fixed key components 50 may be provided on the top and bottom surfaces of the shelf 20a such that the shelf 20a may be used in a top slot 12 or a bottom slot 12, while engaging the same left and right adjustable key components 30, for example. Further, as alluded to above, front and back fixed key components 50 may be used. In such case, the front and back fixed key components 50 do not have to be "pegs," but may be formed together as rails that traverse the shelf 20a from front to back. This is made possible by the fact that the keying of the present disclosure is based on the offset of the fixed key components 50, and not necessarily their shape. This offset may be on the order of 1-2 mm between configurations, for example.

Figure 8:
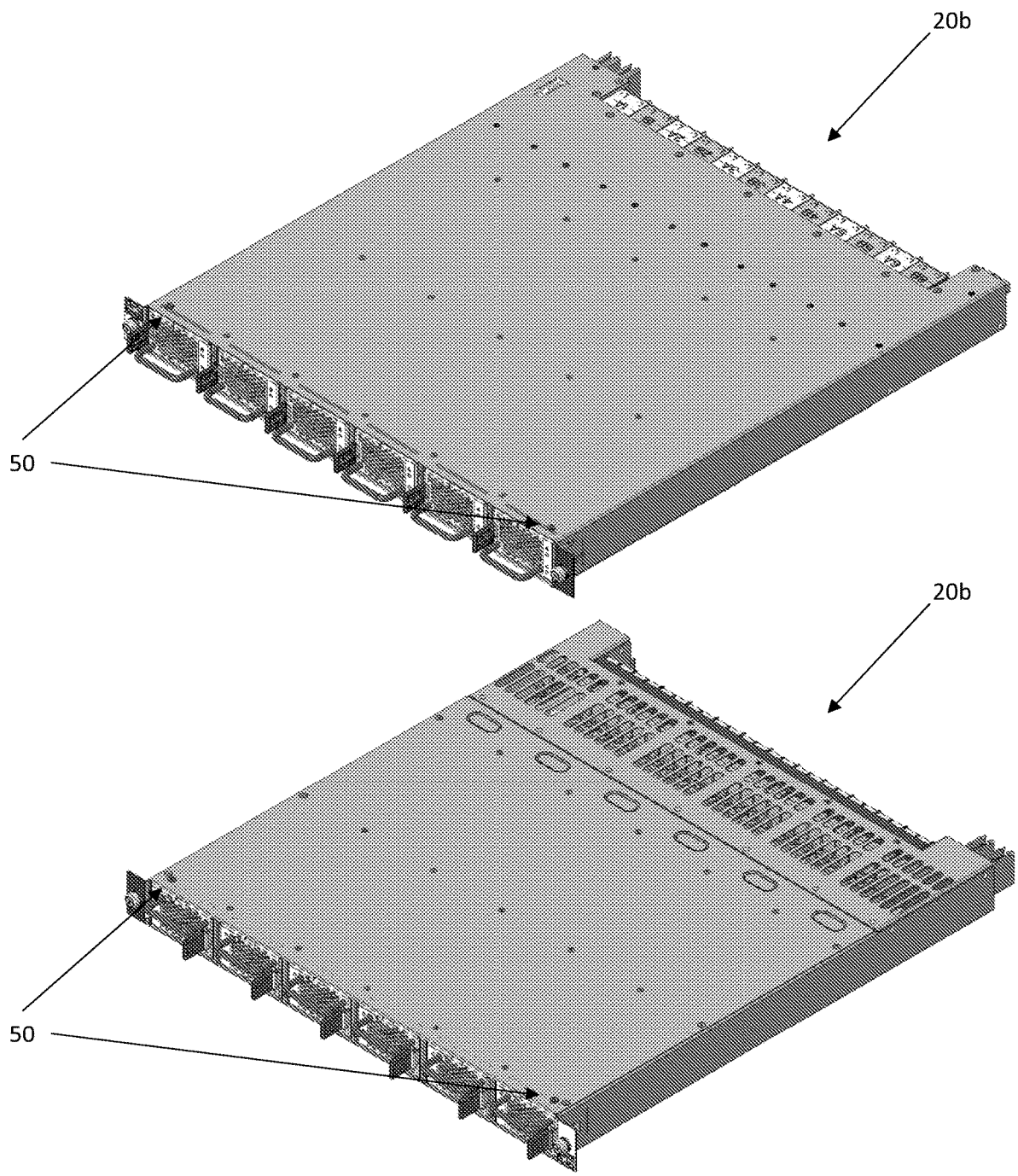
FIG. 8 is top and bottom perspective views of a type B power shelf, highlighting the associated fixed key components.

FIG. 8 is top and bottom perspective views of a type B power shelf 20b, highlighting the associated fixed key components 50. These fixed key components 50 may be disposed at the left and right sides of the front portion of the shelf 20b, for example, to mate with left and right adjustable key components 30 (FIGS. 4-6) of the corresponding slot(s) 12 (FIGS. 1, 2, and 4-6). Fixed key components 50 may be provided on the top and bottom surfaces of the shelf 20b such that the shelf 20b may be used in a top slot 12 or a bottom slot 12, while engaging the same left and right adjustable key components 30, for example. Further, as alluded to above, front and back fixed key components 50 may be used. In such case, the front and back fixed key components 50 do not have to be "pegs," but may be formed together as rails that traverse the shelf 20b from front to back. Again, this is made possible by the fact that the keying of the present disclosure is based on the offset of the fixed key components 50, and not necessarily their shape. This offset may be on the order of 1-2 mm between configurations, for example.

Figure 9:
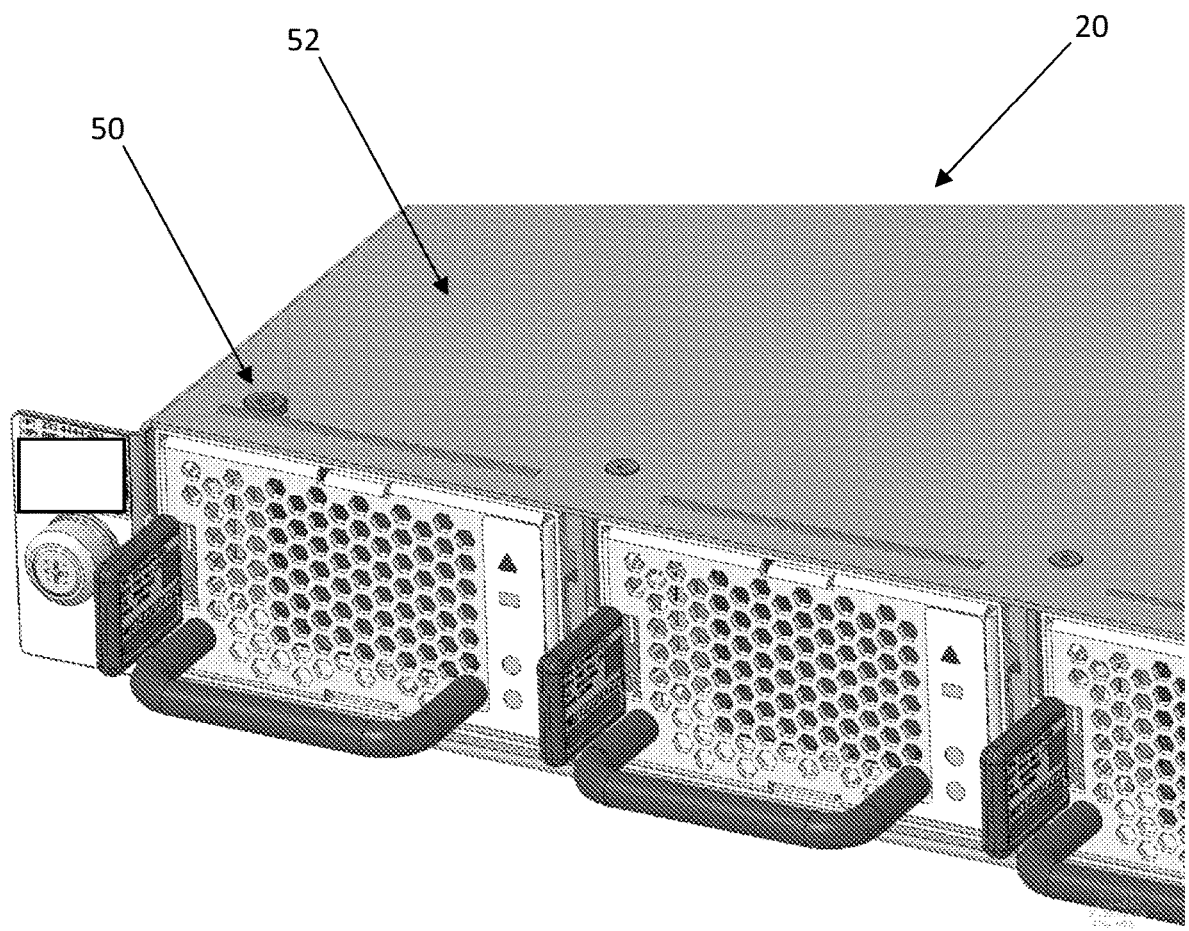
FIG. 9 is a perspective view of one embodiment of a fixed key component of the present disclosure.

FIG. 9 is a perspective view of one embodiment of the fixed key component 50 of the present disclosure. As is illustrated, the fixed key component 50 is a cylindrical protrusion extending from a corresponding surface 52 of the associated shelf 20, in this case a top surface 52 (which, alternatively, could be a bottom surface or a side surface, or even a front surface or a back surface if top, bottom, or side protrusion is still present). The fixed key component 50 may have any suitable shape and need not be cylindrical. As provided above, the fixed key component 50 may be a rail that traverses the shelf 20 from front to back in the base that a grooved adjustable key component 30 (FIGS. 4-6) is used.

Figure 10:
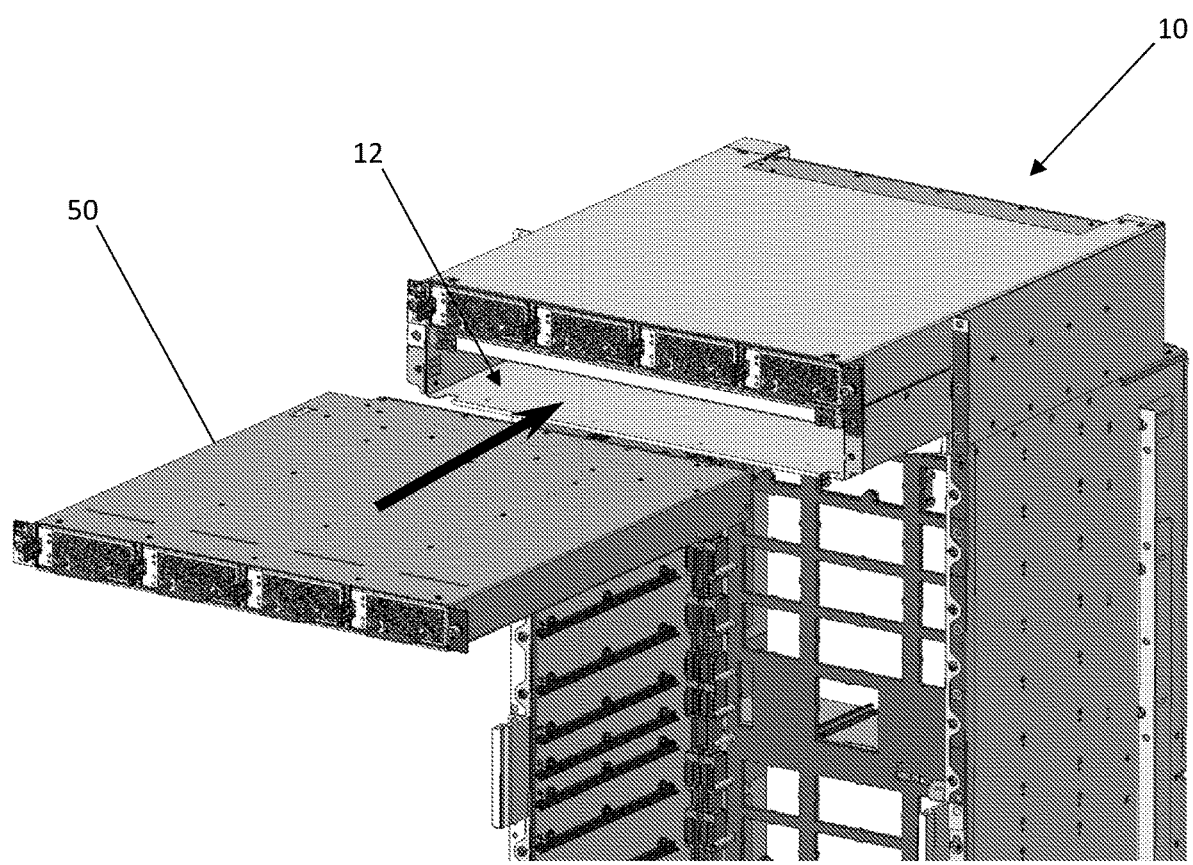
FIG. 10 is a perspective view of a shelf being inserted into a slot using the adjustable key components and the fixed key components of the present disclosure to ensure shelf/slot compatibility.

FIG. 10 is a perspective view of a shelf 50 being inserted into a slot 12 using the adjustable key components 30 (FIGS.

4-6) and the fixed key components (FIG. 7-9) of the present disclosure to ensure shelf/slot compatibility.

FIG. 11 is a series of perspective views of another embodiment of the adjustable key component 30 of the present disclosure, the adjustable key component 30 being translatable between multiple (position 1, position 2, and position 3) configurations. It will be readily apparent to those of ordinary skill in the art that any number of positions/detents may be utilized. The adjustable key component 30 again includes a slider member 32 that is translated along a front edge 34 of a slot or, as illustrated, along a shared front edge 34 of adjacent (vertically-stacked) slots. A window 60 manufactured into the slider member 32 is adapted to selectively cover and expose the visual position indicators 40 provided at the front edge 34 of the slot(s). Again, if left and right adjustable key components 30 are utilized, the left adjustable key component 30 can be disposed in multiple configurations and the right adjustable key component 30 can also be disposed in multiple configurations, providing a plurality of discrete key combinations when used together. The slider member 32, which may be manufactured from a plastic or other suitable rigid material, defines the translating channel 42 in an outside surface thereof that forms the key slot for receiving the fixed key component of the associated shelf when the shelf is inserted into the slot served by the slider member 32. This channel 42 is translated with the slider member 32 between positions, such that only a corresponding fixed key component associated with a given type of shelf can be received in each position, as the various fixed key components are correspondingly offset.

FIG. 12 is a series of front planar and perspective views of a further embodiment of the adjustable key component 30 of the present disclosure, the adjustable key component 30 being rotatable between multiple (position A, position B, position C, and position D) configurations. It will be readily apparent to those of ordinary skill in the art that any number of positions/sides/detents may be utilized. The adjustable key component 30 here includes a rotating knob 62 that is rotated at a front edge 34 of a slot or, as illustrated, along a shared front edge 34 of adjacent (vertically-stacked) slots. Visual position indicators 64 are provided on the various sides of the rotating knob 62. Again, if left and right adjustable key components 30 are utilized, the left adjustable key component 30 can be disposed in multiple configurations and the right adjustable key component 30 can also be disposed in multiple configurations, providing a plurality of discrete key combinations when used together. The sides of the rotating knob 62, which may be manufactured from a plastic or other suitable rigid material, define the alternatively selectable channels 42 or grooves 43 in the outside surfaces thereof that form the alternatively selectable key slots for receiving the fixed key components of the associated shelves when the shelves are inserted into the appropriately keyed slot served by the rotating knob 62. The channel 42 or groove 43 is again effectively translated between translated positions along the front edge 34, in this case by rotation of the rotating knob 62, such that only a corresponding fixed key component associated with a given type of shelf can be received in each position, as the various fixed key components are correspondingly offset. As is illustrated, the channel 42 or groove 43 located in one side of the rotating knob 62 is offset relative to the channel 42 located in another side of the rotating knob 62, such that when one channel 42 is replaced by another channel 42 or groove 43 via rotation of the rotating knob 62 at the front edge 34 of the slot(s), the channel 42 or groove 43 used as the key is effectively translated along the front edge 34 of the slot(s) by rotation of the rotating knob 62.

Thus, again, the present disclosure provides adjustable shelf/slot keying assemblies and methods for telecommunications and networking equipment. Each slot of a housing includes at least one adjustable key component that is adapted to receive only a shelf that includes at least one corresponding fixed key component. For example, each slot may include a left adjustable key component and a right adjustable key component, although additional/alternative adjustable key components (e.g., center, top, bottom) may be utilized, with each shelf including a corresponding left fixed key component and right fixed key component (and/or center fixed key component, top fixed key component, bottom fixed key component, etc.). Each adjustable key component may be disposed in multiple configurations, such that multiple shelf compatibility configurations may be established by a manufacturer or user of the housing, which each slot then only accepting a correspondingly fixed keyed shelf. The adjustable key components are preferably disposed near the front of each slot, such that they may be adjusted and viewed by a user before and as a shelf is slotted. The adjustable key components may serve multiple slots and shelves simultaneously, such as vertically-stacked slots and shelves, for example. The fixed key components of the shelves may be disposed near the front and/or back of each shelf, such that they may guide the slotting and/or final seating of a shelf. The adjustable shelf/slot keying assemblies of the present disclosure ensure that only compatible shelves, such as power shelves or the like, are used together in a housing.

Although the present disclosure is illustrated and described with reference to illustrative embodiments and specific examples, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

The invention claimed is:

1. A telecommunications and networking equipment housing comprising:
    a body defining a slot adapted to receive a shelf through a front edge of the slot; and
    an adjustable key component coupled to the body at the front edge of the slot and defining a channel adapted to receive a fixed key component coupled to the shelf, wherein the channel is movable between a first location and a second location along the front edge of the slot.

2. The housing of claim 1, wherein the fixed key component coupled to the shelf is aligned with the channel defined by the adjustable key component in either the first location or the second location.

3. The housing of claim 1, wherein the adjustable key component is translatable along the front edge of the slot such that the channel is movable between the first location and the second location.

4. The housing of claim 1, wherein the adjustable key component is rotatable with respect to the front edge of the slot such that the channel intended to receive the fixed key component is movable between the first location and the second location via rotation of the adjustable key component.

5. The housing of claim 1, wherein the adjustable key component comprises a first key component that is disposable in a recess formed in the front edge of the slot and a second key component that is disposable in the recess formed in the front edge of the slot, such that the channel intended to receive the fixed key component is movable between the first location and the second location by switching between the first key component and a first channel defined by the first key component being coupled to the body and the second key component and a second channel defined by the second key component being coupled to the body.

6. The housing of claim 1, wherein the channel comprises a recess with a stop located at a back portion thereof, wherein the recess is adapted to receive and retain a front fixed key disposed at a front portion of the shelf when the shelf is fully inserted into the slot.

7. The housing of claim 1, wherein the channel comprises a groove, wherein the groove is adapted to receive and pass through a back fixed key disposed at a back portion of the shelf when the shelf is partially inserted into the slot and receive and retain a front fixed key disposed at a front portion of the shelf when the shelf is fully inserted into the slot.

8. The housing of claim 1, wherein:
the body defines an additional slot disposed adjacent to the slot adapted to receive an additional shelf adjacent to the shelf; and
the adjustable key component defines an additional channel adjacent to the channel adapted to receive an additional fixed key component coupled to the additional shelf, wherein the additional channel is movable between a first location and a second location along a front edge of the additional slot as the channel is movable between the first location and the second location along the front edge of the slot.

9. The housing of claim 1, further comprising a backplane disposed at a back portion of the housing and adapted to make an electrical connection with a connector disposed at a back portion of the shelf when the shelf is fully inserted into the slot.

10. A telecommunications and networking equipment assembly comprising:
a shelf comprising a fixed key component coupled to an external surface thereof; and
a housing comprising:
a body defining a slot adapted to receive the shelf through a front edge of the slot; and
an adjustable key component coupled to the body at the front edge of the slot and defining a channel adapted to receive the fixed key component coupled to the shelf, wherein the channel is movable between a first location and a second location along the front edge of the slot.

11. The assembly of claim 10, wherein the fixed key component coupled to the shelf is aligned with the channel defined by the adjustable key component in either the first location or the second location.

12. The assembly of claim 10, wherein the adjustable key component is translatable along the front edge of the slot such that the channel is movable between the first location and the second location.

13. The assembly of claim 10, wherein the adjustable key component is rotatable with respect to the front edge of the slot such that the channel intended to receive the fixed key component is movable between the first location and the second location via rotation of the adjustable key component.

14. The assembly of claim 10, wherein the adjustable key component comprises a first key component that is disposable in a recess formed in the front edge of the slot and a second key component that is disposable in the recess formed in the front edge of the slot, such that the channel intended to receive the fixed key component is movable between the first location and the second location by switching between the first key component and a first channel defined by the first key component being coupled to the body and the second key component and a second channel defined by the second key component being coupled to the body.

15. The assembly of claim 10, wherein the channel comprises a recess with a stop located at a back portion thereof, wherein the recess is adapted to receive and retain a front fixed key disposed at a front portion of the shelf when the shelf is fully inserted into the slot.

16. The assembly of claim 10, wherein the channel comprises a groove, wherein the groove is adapted to receive and pass through a back fixed key disposed at a back portion of the shelf when the shelf is partially inserted into the slot and receive and retain a front fixed key disposed at a front portion of the shelf when the shelf is fully inserted into the slot.

17. The assembly of claim 10, further comprising an additional shelf comprising an additional fixed key component coupled to an external surface thereof, wherein:
the body defines an additional slot disposed adjacent to the slot adapted to receive the additional shelf adjacent to the shelf; and
the adjustable key component defines an additional channel adjacent to the channel adapted to receive the additional fixed key component coupled to the additional shelf, wherein the additional channel is movable between a first location and a second location along a front edge of the additional slot as the channel is movable between the first location and the second location along the front edge of the slot.

18. The assembly of claim 10, the housing further comprising a backplane disposed at a back portion thereof and adapted to make an electrical connection with a connector disposed at a back portion of the shelf when the shelf is fully inserted into the slot.

19. A telecommunications and networking equipment method comprising:
given a housing comprising a body defining a slot adapted to receive a shelf through a front edge of the slot and an adjustable key component coupled to the body at the front edge of the slot and defining a channel adapted to receive a fixed key component coupled to the shelf, wherein the channel is movable between a first location and a second location along the front edge of the slot, moving the channel between the first location and the second location.

20. The method of claim 19, wherein the fixed key component coupled to the shelf is aligned with the channel defined by the adjustable key component in the second location, the method further comprising inserting the shelf into the slot with the fixed key component coupled to the shelf engaging the channel defined by the adjustable key component.

\* \* \* \* \*